United States Patent
Lee et al.

(10) Patent No.: US 12,255,654 B2
(45) Date of Patent: Mar. 18, 2025

(54) SLEW RATE ACCELERATION CIRCUIT AND BUFFER CIRCUIT INCLUDING THE SAME

(71) Applicant: Magnachip Mixed-Signal, Ltd., Cheongju-si (KR)

(72) Inventors: Dukmin Lee, Seoul (KR); Kyeongwoo Kim, Siheung-si (KR)

(73) Assignee: Magnachip Mixed-Signal, Ltd., Cheongju-si (KR)

( * ) Notice: Subject to any disclaimer, the term of this patent is extended or adjusted under 35 U.S.C. 154(b) by 0 days.

(21) Appl. No.: 17/497,000

(22) Filed: Oct. 8, 2021

(65) Prior Publication Data

US 2022/0302910 A1  Sep. 22, 2022

(30) Foreign Application Priority Data

Mar. 22, 2021  (KR) ........................ 10-2021-0036348

(51) Int. Cl.
*H03K 5/02* (2006.01)
*H03F 3/45* (2006.01)

(52) U.S. Cl.
CPC ........... *H03K 5/02* (2013.01); *H03F 3/45475* (2013.01)

(58) Field of Classification Search
CPC .............................. H03K 5/02; H03F 3/45475
See application file for complete search history.

(56) References Cited

U.S. PATENT DOCUMENTS

| | | | |
|---|---|---|---|
| 6,771,126 B2 * | 8/2004 | Blankenship | H03F 3/45192 330/261 |
| 7,391,264 B2 * | 6/2008 | Watanabe | H03F 3/45475 330/290 |
| 7,772,816 B2 * | 8/2010 | Cho | G05F 1/56 323/280 |
| 7,808,281 B1 * | 10/2010 | Hsiao | H03K 19/018528 326/115 |
| 9,543,912 B2 * | 1/2017 | Lee | H03F 3/301 |
| 2003/0020531 A1 * | 1/2003 | Kaushik | H03K 17/166 327/380 |
| 2010/0171727 A1 * | 7/2010 | Chen | H03K 17/0412 345/208 |
| 2012/0062776 A1 * | 3/2012 | Egawa | H04N 5/378 348/E9.031 |

(Continued)

FOREIGN PATENT DOCUMENTS

| | | | | |
|---|---|---|---|---|
| CN | 1607729 A | * | 4/2005 | ........... H03K 17/166 |
| CN | 1734548 A | * | 2/2006 | ........... G09G 3/3688 |

(Continued)

OTHER PUBLICATIONS

Korean Office Action Issued on Oct. 26, 2024, in Counterpart Korean Patent Application No. 10-2021-0036348 (5 Pages in English, 5 Pages in Korean).

*Primary Examiner* — Lincoln D Donovan
*Assistant Examiner* — James G Yeaman
(74) *Attorney, Agent, or Firm* — NSIP Law

(57) ABSTRACT

A slew rate acceleration circuit in a buffer circuit, is configured at least to detect a current flowing through a load stage of the buffer circuit, compare a value of the detected current with a reference value, and supply an adjusting driving voltage to an output stage of the buffer circuit based on results of the comparison for increasing a slew rate of the buffer circuit.

14 Claims, 6 Drawing Sheets

(56) References Cited

U.S. PATENT DOCUMENTS

| | | | | |
|---|---|---|---|---|
| 2012/0133393 A1* | 5/2012 | Matsuoka | ...... | H03K 19/017581 |
| | | | | 326/83 |
| 2013/0249635 A1* | 9/2013 | Kim | .................. | H03F 3/45219 |
| | | | | 330/261 |
| 2019/0120883 A1* | 4/2019 | Shen | ..................... | H03F 3/2173 |

FOREIGN PATENT DOCUMENTS

| | | | | | |
|---|---|---|---|---|---|
| CN | 203851128 | U | * | 9/2014 | |
| CN | 105022440 | A | * | 11/2015 | |
| CN | 110233582 | A | * | 9/2019 | .............. H02M 1/08 |
| CN | 110350907 | A | * | 10/2019 | ................ G05F 3/16 |
| CN | 110928358 | B | * | 3/2020 | ................ G05F 3/26 |
| CN | 112054772 | A | * | 12/2020 | ........... H03K 17/161 |
| CN | 108475490 | B | * | 1/2021 | ........... G09G 3/3233 |
| DE | 102007024064 | A1 | * | 11/2007 | ............. G05F 1/573 |
| JP | 2010114315 | A | * | 5/2010 | |
| KR | 950005023 | B1 | * | 3/1988 | |
| KR | 10-2009-0026998 | A | | 3/2009 | |
| KR | 100996193 | B1 | * | 9/2009 | ............. G05F 3/262 |
| KR | 10-2017-0073481 | A | | 6/2017 | |
| KR | 102194978 | B1 | * | 12/2020 | |
| TW | 421737 | B | * | 2/2001 | ........... H03K 17/161 |
| TW | I542140 | B | * | 4/2016 | |

* cited by examiner (a)

(b)

(c)

(a)

(b)

(c)

SLEW RATE ACCELERATION CIRCUIT AND BUFFER CIRCUIT INCLUDING THE SAME

CROSS-REFERENCE(S) TO RELATED APPLICATIONS

This application claims the benefit under 35 USC 119(a) of Korean Patent Application No. 10-2021-0036348 filed on Mar. 22, 2021 in the Korean Intellectual Property Office, the entire disclosure of which is incorporated herein by reference for all purposes.

BACKGROUND

1. Field

The following description relates to a slew rate acceleration circuit and buffer circuit including the same.

2. Description of the Related Art

A buffer circuit can be used to buffer a signal and be employed in various technical fields such as a source driver and a gate driver of a display device, etc. In the case of the display device, the slew rate is becoming an important issue due to a decrease in a horizontal period and the increase in load capacitance due to the increase in size.

The display device includes a source driver for driving a display panel, and the source driver provides a source drive signal corresponding to image data to a data line of the display panel.

The source driver includes a buffer circuit that buffers the source drive signal and outputs to prevent the source drive signal from being distorted due to load components such as the resistance of the data line and a capacitor. An operational amplifier may be used as the buffer circuit.

Recently, as the display device becomes larger and has a higher resolution, the time required to drive one horizontal line is reduced. As a result, a margin required for pull-up or pull-down of the buffer circuit cannot be secured, and the source drive signal cannot reach a target voltage within a predetermined period of time, resulting in a problem of deteriorating the image quality.

To solve the above-described problems, it is possible to consider a method for improving the slew rate of the buffer circuit by increasing a bias current of the buffer circuit. However, this requires an increase in power consumption.

Therefore, there is a demand for a buffer circuit to obtain a stable high slew rate without increasing power consumption.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a slew rate acceleration circuit in a buffer circuit, is configured at least to detect a current flowing through a load stage of the buffer circuit, compare a value of the detected current with a reference value, and supply an adjusting driving voltage to an output stage of the buffer circuit based on results of the comparison for increasing a slew rate of the buffer circuit.

The load stage of the buffer circuit may include at least one current mirror circuit, and the slew rate acceleration circuit may be further configured to detect the current flowing through the load stage based on a gate voltage of a transistor in the current mirror circuit.

The slew rate acceleration circuit may include a current detection circuit configured to form a current mirror with the current mirror circuit of the load stage.

The current detection circuit may include a current sensing transistor configured to perform a current mirror operation with respect to the current flowing through the load stage, and a gate electrode of the current sensing transistor may be connected to a gate electrode of the transistor constituting the current mirror circuit of the load stage.

The slew rate acceleration circuit may further include at least one bias transistor, and the reference value may be controlled based on a gate voltage of the bias transistor.

The output stage may include at least one driving transistor, and the slew rate acceleration circuit may further include a control circuit configured to supply the adjusting driving voltage to a gate electrode of the driving transistor.

The control circuit may include at least one acceleration transistor, and a source electrode of the acceleration transistor may be connected to the gate electrode of the driving transistor.

The current mirror operation may be configured to transmit a control signal to a gate electrode of the acceleration transistor, and the acceleration transistor may be configured to turn on/off based on the control signal.

The output stage may further include first and second driving transistors, the control circuit may further include first and second acceleration transistors, a source electrode of the first driving transistor and a drain electrode of the second acceleration transistor may be connected to a first power supply voltage, and a source electrode of the second driving transistor and a drain electrode of the first acceleration transistor may be connected to a second power supply voltage.

A source electrode of the first acceleration transistor and a gate electrode of the first driving transistor may be connected in common to a first output terminal of the current mirror circuit, and a source electrode of the second acceleration transistor and a gate electrode of the second driving transistor may be connected in common to a second output terminal of the current mirror circuit.

The first driving transistor and the first acceleration transistor may be PMOS transistors, and the second driving transistor and the second acceleration transistor may be NMOS transistors.

In another general aspect, a buffer circuit includes an operational amplifier configured to amplify an input voltage and output an output voltage through an output node, a current detection circuit configured to detect a current flowing through a load stage of the operational amplifier, and a control circuit configured to supply an adjusting driving voltage to accelerate a slew rate of the operational amplifier to an output stage of the operational amplifier based on a control signal.

The load stage may include at least one current mirror circuit, the output stage may include at least one driving transistor, and the control circuit may be configured to supply the adjusting driving voltage to a gate electrode of the driving transistor.

The current detection circuit may include a current sensing transistor configured to perform a current mirror operation with respect to the current flowing through the load stage, and a gate electrode of the current sensing transistor may be connected to a gate electrode of a transistor constituting the current mirror circuit of the load stage.

The control circuit may include at least one acceleration transistor, and a source electrode of the acceleration transistor may be connected to the gate electrode of the driving transistor.

The current mirror operation may be configured to transmit the control signal to a gate electrode of the acceleration transistor, and the acceleration transistor may be configured to turn on/off based on the control signal.

The output stage may further include first and second driving transistors, the control circuit may further include first and second acceleration transistors, a source electrode of the first driving transistor and a drain electrode of the second acceleration transistor may be connected to a first power supply voltage, and a source electrode of the second driving transistor and a drain electrode of the first acceleration transistor may be connected to a second power supply voltage.

A source electrode of the first acceleration transistor and a gate electrode of the first driving transistor may be connected in common to a first output terminal of the current mirror circuit, and a source electrode of the second acceleration transistor and a gate electrode of the second driving transistor may be connected in common to a second output terminal of the current mirror circuit.

The first driving transistor and the first acceleration transistor may be PMOS transistors, and the second driving transistor and the second acceleration transistor may be NMOS transistors.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
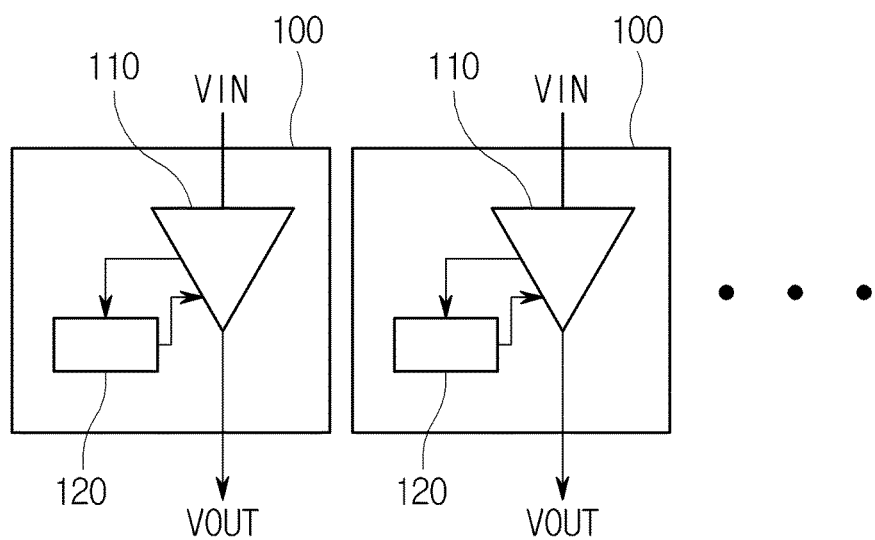
FIG. 1 is a block diagram of an example of a buffer circuit according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram of a buffer circuit according to one or more embodiments of the present disclosure.

Referring to FIG. 1, a buffer circuit 100 may receive an input voltage VIN and output an output voltage VOUT based on the input voltage VIN. According to one or more embodiments, the buffer circuit 100 may buffer the input voltage VIN and output it as the output voltage VOUT. For example, the output voltage VOUT may be generated by amplifying the input voltage VIN.

In the present specification, when a random voltage is received, a line through which the random voltage is supplied is electrically connected to a corresponding configuration.

The buffer circuit 100 may include an operational amplifier 110 and a slew rate acceleration circuit 120. In addition, each buffer circuit 100 may include the operational amplifier and the slew rate acceleration circuit according to one or more embodiments.

The operational amplifier 110 may amplify the input voltage VIN and output it as the output voltage VOUT. In an ideal case, the operational amplifier 110 can output the output voltage VOUT by immediately responding to the application of the input voltage VIN; however, in an actual case, a transition between the input voltage VIN and the output voltage VOUT may take time (i.e., a transition time). This transition time can be represented as a slew rate.

The slew rate acceleration circuit 120 may control the slew rate of the operational amplifier 110. According to one or more embodiments, the slew rate acceleration circuit 120 may receive a value of an operation current flowing inside the operational amplifier 110, and may adjust the transition time between the input voltage VIN and the output voltage VOUT based on the value of the operation current. For example, when the value of the operation current flowing inside the operational amplifier 110 exceeds a reference value, the slew rate acceleration circuit 120 may be turned on, and the transition time between the input voltage VIN and the output voltage VOUT may be reduced.

Figure 2:
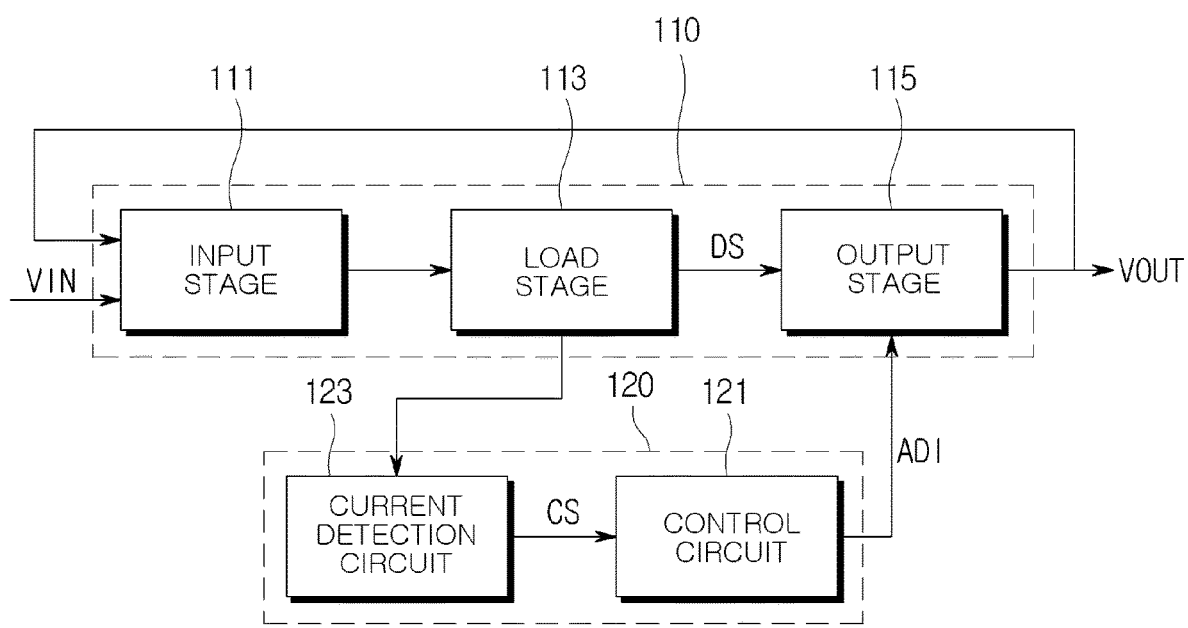
FIG. 2 is a more detailed block diagram of an example of the buffer circuit of FIG. 1 according to one or more embodiments of the present disclosure.

FIG. 2 is a more detailed block diagram of the buffer circuit of FIG. 1 according to one or more embodiments of the present disclosure.

Referring to FIGS. 1 and 2, the operational amplifier 110 may include an input stage 111, a load stage 113, and an output stage 115.

The input stage 111 may receive the input voltage VIN and the output voltage VOUT, and may determine a magnitude of a difference between the input voltage VIN and the output voltage VOUT. In addition, the input stage 111 may be electrically connected to the load stage 113.

The load stage 113 may determine a gain of the operational amplifier 110. According to one or more embodiments, the load stage 113 may amplify the input voltage VIN according to the gain and transmit the amplified input voltage to the output stage 115.

The load stage 113 may transmit a drive signal DS to control output stage 115 to the output stage 115. For example, the drive signal DS may be a pull-up or pull-down voltage used in the operational amplifier 110.

The output stage 115 may output the output voltage VOUT in response to the drive signal DS. According to one or more embodiments, the output stage 115 may be turned on by the drive signal DS and may output the output voltage VOUT.

The output stage 115 may receive an adjusting driving voltage ADI from the slew rate acceleration circuit 120, and accordingly, the slew rate of the output stage 115 may be accelerated.

The slew rate acceleration circuit 120 may include a control circuit 121 and a current detection circuit 123.

The control circuit 121 may be connected to the output stage 115 of the operational amplifier 110. The control circuit 121 may accelerate the slew rate of the output stage 115 by supplying the adjusting driving voltage ADI to the output stage 115. According to one or more embodiments, when the input voltage VIN at the output stage 115 transitions to the output voltage VOUT, the control circuit 121 supplies the adjusting driving voltage ADI to the output stage 115, thereby causing the input voltage VIN to transition to the output voltage VOUT faster so that the slew rate of the output stage 115 can be accelerated.

The current detection circuit 123 may output a control signal CS for controlling the control circuit 121. According to one or more embodiments, the current detection circuit 123 may output the control signal CS to the control circuit 121 in accordance with the difference between the input voltage VIN and the output voltage VOUT. The control circuit 121 may be turned on (or enabled) in response to the control signal CS, and may supply the adjusting driving voltage ADI to the output stage 115.

The slew rate acceleration circuit 120 according to one or more embodiments of the subject disclosure may receive the value of the operation current flowing inside the operational amplifier 110, and may accelerate the transition time between the input voltage VIN and the output voltage VOUT based on the value of the operation current.

Figure 3:
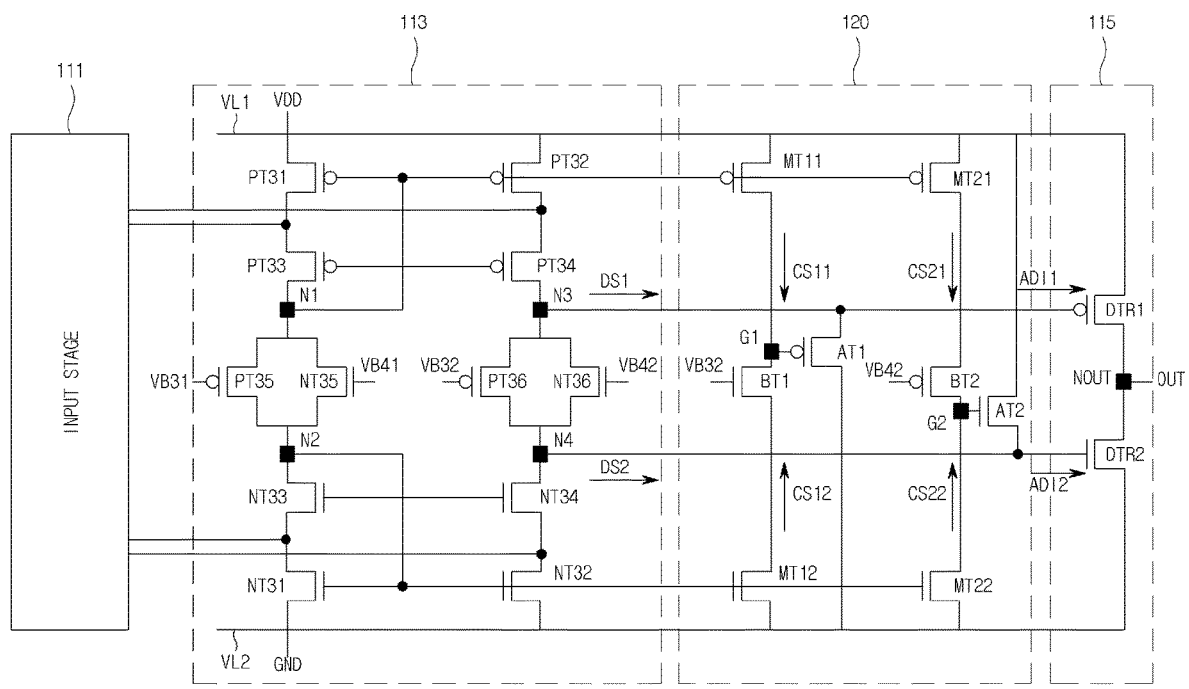
FIG. 3 is a circuit diagram showing in more detail the block diagram of the buffer circuit of FIG. 2 according to one or more embodiments of the present disclosure.

FIG. 3 is a circuit diagram showing in more detail the block diagram of the buffer circuit of FIG. 2 according to one or more embodiments of the present disclosure.

Referring to FIGS. 1 to 3, the load stage 113 may include an upper current mirror circuit, a lower current mirror circuit, a first connection circuit, and a second connection circuit.

The upper current mirror circuit may include PMOS transistors PT31 and PT32 connected in the form of a current mirror. The upper current mirror circuit may include a first output terminal N3. The lower current mirror circuit may include NMOS transistors NT31 and NT32 connected in the form of the current mirror. The lower current mirror circuit may include a second output terminal N4.

The first connection circuit may include a PMOS transistor PT35 which operates in response to a first bias voltage VB31, and an NMOS transistor NT35, which operates in response to a second bias voltage VB41. The second connection circuit may include a PMOS transistor PT36 which operates in response to a third bias voltage VB32, and an NMOS transistor NT36, which operates in response to a fourth bias voltage VB42.

The upper current mirror circuit and the lower current mirror circuit are electrically connected to the input stage and supply a current to the output stage 115. The first connection circuit electrically connects a first gate common terminal N1 of the upper current mirror circuit and a second gate common terminal N2 of the lower current mirror circuit. The second connection circuit electrically connects the first output terminal N3 of the upper current mirror circuit and the second output terminal N4 of the lower current mirror circuit.

The load stage 113 may include an upper cascode circuit connected between the upper current mirror circuit and the connection circuits. And, the upper cascode circuit is composed of PMOS transistors PT33 and PT34. Also, the load stage 113 may include a lower cascode circuit connected between the lower current mirror circuit and the connection circuits. And, the lower cascode circuit is composed of NMOS transistors NT33 and NT34. Since the load stage, including the cascode circuits, has a large output impedance, the buffer circuit, including the load stage, can obtain a high voltage gain.

The output stage 115 may be connected to a first power supply line VL1 and a second power supply line VL2 and may receive a power supply voltage. For example, the first power supply line VL1 may be connected to a power supply voltage VDD, and the second power supply line VL2 may be connected to a ground GND.

The output stage 115 may include two driving transistors DTR1 and DTR2. According to one or more embodiments, the output stage 115 may include the first driving transistor DTR1 connected between the first power supply line VL1 and an output node NOUT, and the second driving transistor DTR2 connected between the second power supply line VL2 and the output node NOUT.

A gate terminal of the first driving transistor DTR1 is connected to the first output terminal N3 of the upper current mirror circuit. And the first driving transistor DRT1 is connected between the power supply voltage VDD and the output node NOUT. A gate terminal of the second driving transistor DTR2 is connected to the second output node N4 of the lower current mirror circuit. And the second driving transistor DTR2 is connected between the output node NOUT and the grout GND.

The first driving transistor DTR1 is turned on/off in response to a first drive signal DS1 transmitted from the load stage 113, and the second driving transistor DTR2 is turned on/off in response to a second drive signal DS2 transmitted from the load stage 113. According to one or more embodiments, the first driving transistor DTR1 may perform a pull-up operation, and the second driving transistor DTR2 may perform a pull-down operation.

The first driving transistor DTR1 and the second driving transistor DTR2 may operate complementarily. For example, when the first driving transistor DTR1 is turned on, the second driving transistor DTR2 may be turned off, and vice versa.

The control circuit 121 may be connected to the output stage 115. According to one or more embodiments, the control circuit 121 may include two acceleration transistors AT1 and AT2, which supply the adjusting driving voltages ADI1 and ADI2 to the first and second driving transistors DTR1 and DTR2, constituting the output stage 115. The first acceleration transistor AT1 may supply the first adjusting driving voltage ADI1 to the first driving transistor DTR1. The first adjusting driving voltage ADI1 may be a pull-down signal. The second acceleration transistor AT2 may supply the second adjusting driving voltage ADI2 to the second driving transistor DTR2. The second adjusting driving voltage ADI2 may be a pull-up signal.

The first acceleration transistor AT1 is connected between the first output terminal N3 of the upper current mirror circuit and the first driving transistor DTR1 constituting the output stage. The second acceleration transistor AT2 is connected between the second output terminal N4 of the lower current mirror circuit and the second driving transistor DTR2 constituting the output stage.

According to one or more embodiments, the first acceleration transistor AT1 may be a PMOS transistor, and the second acceleration transistor AT2 may be an NMOS transistor. A gate of the first acceleration transistor AT1 may be connected to the current detection circuit 123. A source of the first acceleration transistor AT1 may be connected between the first output terminal N3 of the upper current mirror circuit and the gate terminal of the first driving transistor DTR1. Also, a drain of the first acceleration transistor AT1 may be connected to the second power supply line VL2, and thus a ground voltage GND is supplied. A gate of the second acceleration transistor AT2 may be connected to the current detection circuit 123. A source of the second acceleration transistor AT2 may be connected between the second output terminal N4 of the lower current mirror circuit and the gate terminal of the second driving transistor DTR2. Also, a drain of the second acceleration transistor AT2 may be connected to the first power supply line VL1, and thus the power supply voltage VDD is supplied.

The first acceleration transistor AT1 may be operated by being turned on/off in response to first and second control signals CS11 and CS12 transmitted from the current detection circuit 123. The second acceleration transistor AT2 may be turned on/off in response to third and fourth control signals CS21 and CS22 transmitted from the current detection circuit 123.

The current detection circuit 123 may output the first to fourth control signals CS11, CS12, CS21, and CS22 for turning on/off the control circuit 121. According to one or more embodiments, the current detection circuit 123 may include a first current sensing transistor MT11, a second current sensing transistor MT12, a third current sensing transistor MT21, and a fourth current sensing transistor MT22.

The first current sensing transistor MT11 may be connected to the first power supply line VL1, and the second current sensing transistor MT12 may be connected to the second power supply line VL2. A first bias transistor BT1 is connected between the first current sensing transistor MT11 and the second current sensing transistor MT12.

According to one or more embodiments, the first current sensing transistor MT11 may be a PMOS transistor, and the second current sensing transistor MT12 may be an NMOS transistor. A gate of the first current sensing transistor MT11 may be connected to gate electrodes of the PMOS transistors PT31 and PT32 constituting the upper current mirror circuit of the load stage 113. A gate of the second current sensing transistor MT12 may be connected to gate electrodes of the NMOS transistors NT31 and NT32, constituting the lower current mirror circuit of the load stage 113.

The control circuit 121 has various operations. The first acceleration transistor AT1 may be turned on based on the first drive signal DS1 of the first driving transistor DTR1, the first control signal CS11 of the first current sensing transistor MT11, and the second control signal CS12 of the second current sensing transistor MT12. Specifically, the first acceleration transistor AT1 may be turned on when a voltage difference between the node N3 and a node G1 is greater than or equal to a reference value. At this time, the first control signal CS11 and the second control signal CS12 may acceleratively decrease the voltage value of the node G1, which is a gate voltage of the first acceleration transistor AT1. The reference value may be adjusted according to the third bias voltage VB32 of the first bias transistor BT1. When the first acceleration transistor AT1 is turned on, the first adjusting driving voltage ADI1 may be supplied to the first driving transistor DTR1. The first adjusting driving voltage ADI1 may be a pull-down signal.

Specifically, when a voltage difference between the node N3 and the node G1 is less than the reference value, the first acceleration transistor AT1 may be turned off. At this time, the first control signal CS11 and the second control signal CS12 may acceleratively increase the voltage value of the node G1, that is, the gate voltage of the first acceleration transistor AT1. The reference value may be adjusted according to the third bias voltage VB32 of the first bias transistor BT1.

The second acceleration transistor AT2 may be turned on based on the second drive signal DS2 of the second driving transistor DTR2, the third control signal CS21 of the third current sensing transistor MT21, and the fourth control signal CS22 of the fourth current sensing transistor MT22. Specifically, the second acceleration transistor AT2 may be turned on when a voltage difference between the node N4 and a node G2 is greater than or equal to a reference value. At this time, the third control signal CS21 and the fourth control signal CS22 may acceleratively increase a voltage value of the node G2, which is a gate voltage of the second acceleration transistor AT2. The reference value may be adjusted according to the fourth bias voltage VB42 of a second bias transistor BT2. When the second acceleration transistor AT2 is turned on, the second adjusting driving voltage ADI2 may be supplied to the second driving transistor DTR2. The second adjusting driving voltage ADI2 may be a pull-up signal.

Also, the second acceleration transistor AT2 may be turned off based on the second drive signal DS2 of the second driving transistor DTR2, the third control signal CS21 of the third current sensing transistor MT21, and the fourth control signal CS22 of the fourth current sensing transistor MT22. Specifically, the second acceleration transistor AT2 may be turned off when the voltage difference between the node N4 and the node G2 is less than the reference value. At this time, the third control signal CS21 and the fourth control signal CS22 may acceleratively decrease the voltage value of the node G2, which is the gate voltage of the second acceleration transistor AT2. The reference value may be adjusted according to the fourth bias voltage VB42 of the second bias transistor BT2.

Figure 4:
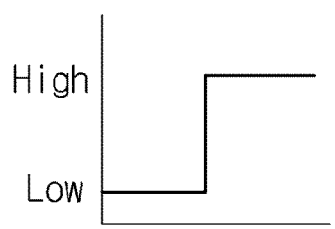
FIGS. 4 and 5 show waveforms of examples of an input signal voltage, a gate voltage of an acceleration transistor, and an output signal voltage.
Figure 4:
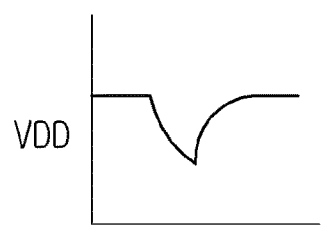
Figure 4:
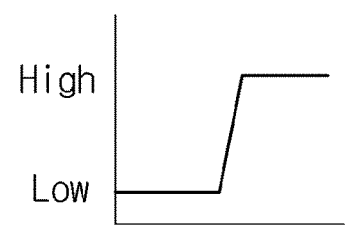
Figure 5:
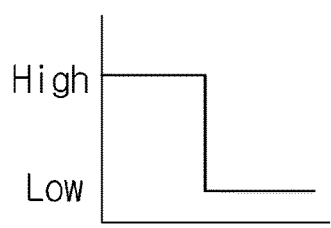
Figure 5:
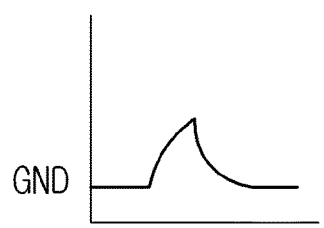
Figure 5:
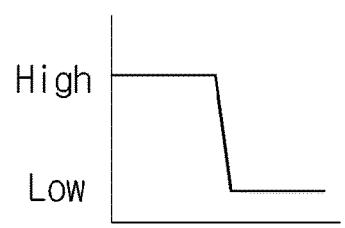

FIGS. 4 and 5 show waveforms of an input signal voltage, the gate voltage of the acceleration transistor, and an output signal voltage.

FIG. 4 is a view for describing a case where an input signal rises, and FIG. 5 is a view for describing a case where the input signal falls. In each of FIGS. 4 and 5, a waveform diagram of the input signal voltage is shown in (a), a waveform diagram of the gate voltage of the acceleration transistor is shown in (b), and a waveform diagram of the output signal voltage is shown in (c).

First, a case where, when the input signal rises (hereinafter, referred to as a rising case), the slew rate is accelerated will be described with reference to FIGS. 1 to 4.

In (a) of FIG. 4, the voltage value of the input signal is rising from low to high.

When the operational amplifier 110 starts a rising change in accordance with the change in the input signal, the slew rate acceleration circuit 120 may receive the value of the operation current flowing inside the operational amplifier 110 and may accelerate the transition time of the output voltage VOUT based on the value of the operation current.

The value of the operation current flowing inside the operational amplifier 110 may be detected by the current detection circuit 123 constituting the slew rate acceleration circuit 120.

The gate of the first current sensing transistor MT11 is connected to the gate electrodes of the PMOS transistors PT31 and PT32, constituting the upper current mirror circuit of the load stage 113. The gate of the second current sensing transistor MT12 is connected to the gate electrodes of the NMOS transistors NT31 and NT32, constituting the lower current mirror circuit of the load stage 113. Through this connection configuration, the current detection circuit 123 may detect the value of the operation current flowing inside the operational amplifier 110 by mirroring the current flowing through the load stage 113 of the operational amplifier 110.

In a section where the input signal of the input stage 111 rises (hereinafter, a rising case), the first current sensing transistor MT11 and the second current sensing transistor MT12 of the current detection circuit 123 output the first control signal CS11 and the second control signal CS12 to the node G1 to which a gate electrode of the first acceleration transistor AT1 is connected, and the gate voltage of the first acceleration transistor AT1 is acceleratively decreased.

As the gate voltage of the first acceleration transistor AT1 acceleratively decreases, the voltage difference between the node N3 and the node G1 becomes greater than or equal to the reference value. Thus, the first acceleration transistor AT1 is turned on. The reference value may be adjusted according to the third bias voltage VB32 of the first bias transistor BT1. When the first acceleration transistor AT1 is turned on, the first adjusting driving voltage ADI1 may be supplied to the first driving transistor DTR1. The first adjusting driving voltage ADI1 may be a pull-down signal. Here, the first driving transistor DTR1 is pulled up, and thus, the output voltage output from the operational amplifier 110 rises. That is to say, the slew rate of the operational amplifier 110 is accelerated.

In a section where the input signal of the rising case becomes a steady state, the first current sensing transistor MT11 and the second current sensing transistor MT12 of the current detection circuit 123 output the first control signal CS11 and the second control signal CS12 to the node G1 to which the gate electrode of the first acceleration transistor AT1 is connected, and the gate voltage of the first acceleration transistor AT1 is acceleratively increased as shown in (b) of FIG. 4. Accordingly, a voltage difference between the node N3 and the node G1 is less than the reference value, so the first acceleration transistor AT1 is turned off. The reference value may be adjusted according to the third bias voltage VB32 of the first bias transistor BT1. Then, the output stage 115 of the operational amplifier 110 becomes a steady-state, and the output voltage of the operational amplifier 110 maintains a DC output.

Next, a case where, when the input signal falls (hereinafter, referred to as a falling case), the slew rate is accelerated will be described with reference to FIGS. 1 to 3 and 5.

In (a) of FIG. 5, the voltage value of the input signal is falling from high to low.

When the operational amplifier 110 starts a falling change in accordance with the change in the input signal, the slew rate acceleration circuit 120 may receive the value of the operation current flowing inside the operational amplifier 110 and may accelerate the transition time between the input voltage VIN and the output voltage VOUT based on the value of the operation current.

The value of the operation current flowing inside the operational amplifier 110 may be detected by the current detection circuit 123 constituting the slew rate acceleration circuit 120.

A gate of the third current sensing transistor MT21 is connected to the gate electrodes of the PMOS transistors PT31 and PT32, constituting the upper current mirror circuit of the load stage 113. A gate of the fourth current sensing transistor MT22 is connected to the gate electrodes of the NMOS transistors NT31 and NT32, constituting the lower current mirror circuit of the load stage 113. Through this connection configuration, the current detection circuit 123 may detect the value of the operation current flowing inside the operational amplifier 110 by mirroring the current flowing through the load stage 113 of the operational amplifier 110.

In a section where the input signal of the falling case falls, the third current sensing transistor MT21 and the fourth current sensing transistor MT22 of the current detection circuit 123 output the third control signal CS21 and the fourth control signal CS22 to the node G2 to which a gate electrode of the second acceleration transistor AT2 is connected, and the gate voltage of the second acceleration transistor AT2 is acceleratively increased.

As the gate voltage of the second acceleration transistor AT2 acceleratively increases, the voltage difference between the node N4 and the node G2 becomes greater than or equal to the reference value. Thus, the second acceleration transistor AT2 is turned on. The reference value may be adjusted according to the fourth bias voltage VB42 of the second bias transistor BT2. When the second acceleration transistor AT2 is turned on, the second adjusting driving voltage ADI2 may be supplied to the second driving transistor DTR2. Here, the second adjusting driving voltage ADI2 may be a pull-up signal. Here, the second driving transistor DTR2 is pulled down, and thus, the output voltage output from the operational amplifier 110 falls. That is to say, the slew rate of the operational amplifier 110 is accelerated.

In a section where the input signal of the falling case becomes a steady-state, the third current sensing transistor MT21, and the fourth current sensing transistor MT22 of the current detection circuit 123 output the third control signal CS21 and the fourth control signal CS22 to the node G2 to which the gate electrode of the second acceleration transistor AT2 is connected, and the gate voltage of the second acceleration transistor AT2 is acceleratively decreased as shown in (b) of FIG. 5. Accordingly, the voltage difference between the node N4 and the node G2 is less than the reference value, so that the second acceleration transistor AT2 is turned off. The reference value may be adjusted according to the fourth bias voltage VB42 of the second bias transistor BT2. Then, the output stage 115 of the operational amplifier 110 becomes a steady-state, and the output voltage of the operational amplifier 110 maintains a DC output.

According to the slew rate acceleration circuit 120, according to one or more embodiments of the subject disclosure, the current detection circuit 123 detects the value of the operation current flowing inside the operational amplifier 110, and the slew rate control is performed based on the operation current flowing inside the operational amplifier 110. Therefore, there is an effect of further improving the slew rate than a conventional voltage sensing method.

Figure 6:
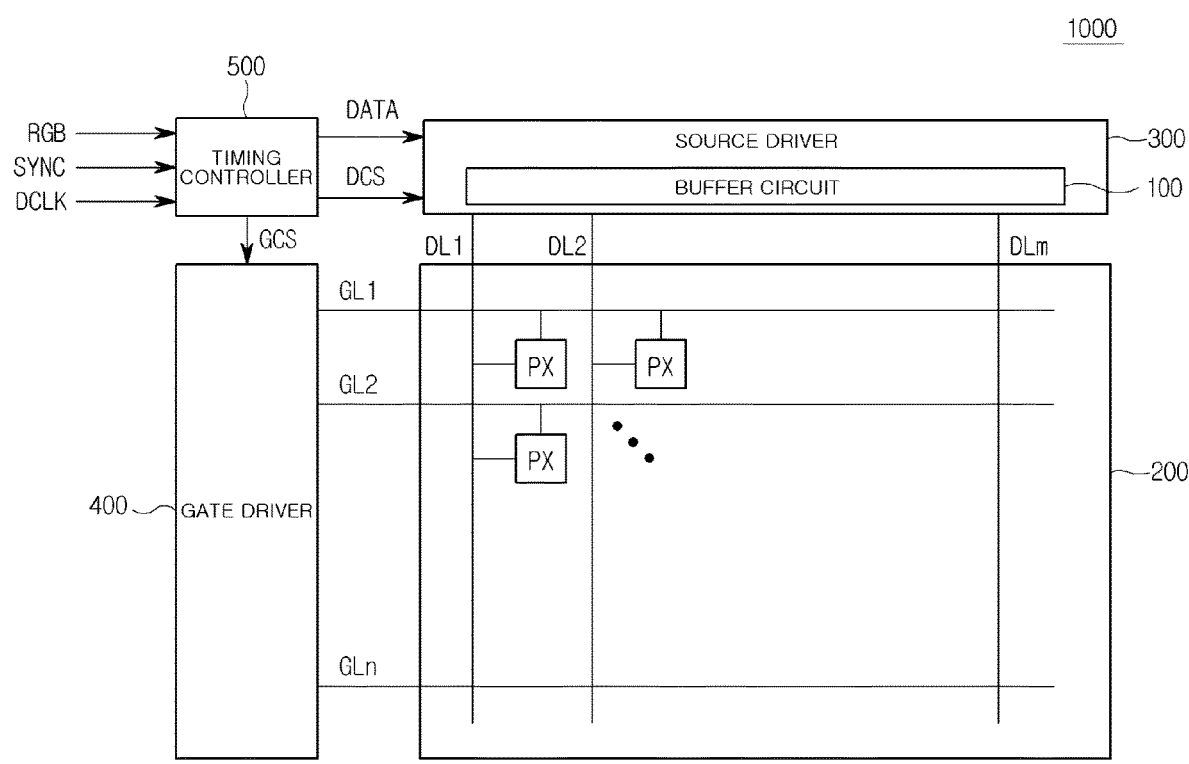
FIG. 6 conceptually shows an example of a display device including the buffer circuit according to one or more embodiments of the present disclosure.

FIG. 6 conceptually shows a display device including a buffer circuit according to one or more embodiments of the present disclosure.

Referring to FIG. 6, a display device 1000 includes a display panel 200, a source driver 300, a gate driver 400, and a timing controller 500.

The source driver 300 may also include the timing controller 500.

According to one or more embodiments, the display device 1000 may be capable of displaying an image or video. For example, the display device 1000 may be included, or includes, a smartphone, a tablet personal computer (PC), a mobile phone, a video phone, an e-book reader, a computer, a camera, a wearable device, etc. However, the display device 1000 is not limited thereto.

The display panel 200 may include a plurality of subpixels PX arranged in rows and columns. For example, the display panel 200 may be implemented with one of a light emitting diode (LED) display, an organic LED (OLED) display, an active-matrix OLED (AMOLED) display, an electrochromic display (ECD), a digital mirror device (DMD), an actuated mirror device (AMD), a grating light valve (GLV), a plasma display panel (PDP), an electro luminescent display (ELD), a vacuum fluorescent display (VFD). However, the display panel 200 is not limited thereto.

The display panel 200 includes a plurality of gate lines GL1 to GLn (n is a natural number) arranged in rows, a plurality of data lines DL1 to DLm (m is a natural number) arranged in columns, and subpixels PX formed at intersections of the plurality of gate lines GL1 to GLn and the plurality of data lines DL1 to DLm. The display panel 200 includes a plurality of horizontal lines, and one horizontal line is composed of the subpixels PX connected to one gate line. During one horizontal period (1H), the subpixels arranged on one horizontal line are driven, and during the next 1H, the subpixels arranged on another horizontal line may be driven.

The subpixels PX may include a light emitting diode (LED) and a diode driving circuit that independently drives the light emitting diode. The diode driving circuit may be connected to one gate line and one data line, and the light emitting diode may be connected between the diode driving circuit and a power supply voltage (e.g., a ground voltage).

The diode driving circuit may include a switching element connected to the gate lines GL1 to GLn, for example, a thin film transistor (TFT). When a gate-on signal is applied from the gate lines GL1 to GLn and the switching element is turned on, the diode driving circuit may provide the light emitting diode with an image signal (or referred to as a pixel signal) received from the data lines DL1 to DLm connected to the diode driving circuit. The light emitting diode may output an optical signal corresponding to the image signal.

Each of the subpixels PX may be one of a red light emitting device R that outputs red light, a green light emitting device G that outputs green light, and a blue light emitting device B that outputs blue light. In the display panel 200, the red light emitting device, the green light emitting device, and the blue light emitting device may be arranged according to various methods. According to one or more embodiments, the subpixels PX of the display panel 200 may be repeatedly arranged in the order of R, G, B, and G or B, G, R, and G, and the like. For example, the pixels PX of the display panel 200 may be arranged according to an RGB stripe structure or an RGB pentile structure. However, the pixels are not limited thereto.

The gate driver 400 may sequentially provide the gate-on signal to the plurality of gate lines GL1 to GLn in response to a gate control signal GCS. For example, the gate control signal GCS may include a gate start pulse that indicates the start of the gate-on signal output and a gate shift clock that controls the output time point of the gate-on signal.

When the gate start pulse is applied, the gate driver 400 may sequentially generate the gate-on signal (e.g., a logic high gate voltage) in response to the gate shift clock, and may sequentially provide the gate-on signal to the plurality of gate lines GL1 to GLn. Here, a gate-off signal (e.g., a logic low gate voltage) is provided to the plurality of gate lines GL1 to GLn during a period in which the gate-on signal is not provided to the plurality of gate lines GL1 to GLn.

The source driver 300 may convert a digital image data DATA into analog image signals in response to a data control signal DCS, and may provide the converted image signals to the plurality of data lines DL1 to DLm. The source driver 300 may provide an image signal corresponding to one horizontal line to the plurality of data lines DL1 to DLm during 1H.

The source driver 300 may include the buffer circuit 100 that transmits a signal to the data lines DL1 to DLm. The buffer circuit 100 may be the buffer circuit 100 described with reference to FIGS. 1 to 3.

The buffer circuit 100 may transmit signals to the display panel 200. The source driver 300 may convert the image data DATA into image signals in response to the data control signal DCS. The source driver 300 may convert the image signals with a gradation voltage corresponding to the image data DATA, and may output the converted image signals to the plurality of data lines DL1 to DLm through the buffer circuit 100.

The timing controller 500 may receive a video image data RGB from the outside and may generate the image data DATA by performing an image processing on the video image data RGB or by converting the video image data RGB to fit the structure of the display panel 200. The timing controller 500 may transmit the image data DATA to the source driver 300.

The timing controller 500 may receive a plurality of control signals from an external host device. The control signals may include a synchronization signal SYNC, and a clock signal DCLK. Also, the synchronization signal SYNC may include a horizontal synchronization signal Hsync, and a vertical synchronization signal Vsync.

The timing controller 500 may generate the gate control signal GCS and the data control signal DCS for controlling the gate driver 400 and the source driver 300 based on the received control signals. The timing controller 500 may control various operation timings of the gate driver 400 and the source driver 300 based on the gate control signal GCS and the data control signal DCS.

According to one or more embodiments, the timing controller 500 may control the gate driver 400 based on the gate control signal GCS such that the gate driver 400 drives the plurality of gate lines GL1 to GLn. The timing controller 500 may control the source driver 300 based on the data control signal DCS such that that the source driver 300 provides the image signal to the plurality of data lines DL1 to DLm.

Each component of the display device 1000 may be composed of a circuit capable of performing a corresponding function.

Methods according to one or more embodiments of the subject disclosure may be implemented with instructions that are stored in a computer-readable storage medium and can be executed by a processor.

Directly and/or indirectly and regardless of whether the storage media is in a raw state, in a formatted state, an organized state, or in any other accessible state, the storage media may include a relational database, a non-relational database, an in-memory database, and a database which can store a data and include a distributed type database, such as other suitable databases that allows access to the data through a storage controller. Also, the storage medium includes a primary storage device, a secondary storage device, a tertiary storage device, an offline storage device, a volatile storage device, a nonvolatile storage device, a semiconductor storage device, a magnetic storage device, an optical storage device, and a flash storage devices, a hard disk drive storage device, a floppy disk drive, a magnetic tape, or any type of storage device such as other suitable data storage medium.

In this specification, the instruction may be one of include assembler instructions, instruction-set-architecture (ISA) instructions, machine instructions, machine-dependent instructions, microcode, firmware instructions, state setting data, and source codes or object codes written in any combination of one or more programming languages including an object-oriented programming language such as Smalltalk, C++, etc., and a conventional procedural programming language such as a "C" programming language or similar programming languages.

As described above, the buffer circuit according to the embodiment of the present disclosure has an effect of reducing a static current. Also, the buffer circuit according to the embodiment receives the value of the operation current flowing inside the operational amplifier and adjusts the transition time between the input voltage VIN and the output voltage VOUT on the basis of the value of the operation current. Therefore, the slew rate at the same level as that of an existing structure can be obtained with a static current that is lower than that of a static current of the existing structure. Also, the buffer circuit according to the embodiment adjusts the transition time between the input voltage VIN and the output voltage VOUT on the basis of the value of the operation current flowing inside the operational amplifier, so that, compared with an existing voltage sensing method, it is possible to obtain a noise reduction effect and to reduce simulation errors.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A slew rate acceleration circuit in a buffer circuit, the slew rate acceleration circuit being configured to:
   detect, via a current detection circuit, a current flowing through a load stage of the buffer circuit, the load stage comprising a current mirror circuit;
   compare, via a control circuit, a value of the detected current with an adjustable reference value; and supply, via the control circuit, an adjusting driving voltage to an output stage comprising at least one driving transistor of the buffer circuit based on results of the comparison for increasing a slew rate of the buffer circuit, wherein the slew rate acceleration circuit comprises a first bias transistor and a second bias transistor, and is configured to adjust the adjustable reference value according to a first bias voltage applied to a gate electrode of the first bias transistor and a second bias voltage applied to a gate electrode of the second bias transistor, wherein the control circuit comprises at least one acceleration transistor, and a source electrode of the at least one acceleration transistor is connected to a gate electrode of the at least one driving transistor, and wherein the slew rate acceleration circuit is further configured to detect the current flowing through the load stage based on a gate voltage of a transistor constituting the current mirror circuit.

2. The slew rate acceleration circuit of claim 1, comprising a current detection circuit configured to form a current mirror with the current mirror circuit of the load stage.

3. The slew rate acceleration circuit of claim 2, wherein the current detection circuit comprises a current sensing transistor configured to perform a current mirror operation with respect to the current flowing through the load stage, and wherein a gate electrode of the current sensing transistor is connected to a gate electrode of the transistor constituting the current mirror circuit of the load stage.

4. The slew rate acceleration circuit of claim 1, wherein the current mirror operation is configured to transmit a control signal to a gate electrode of the at least one acceleration transistor, and each acceleration transistor is configured to turn on/off based on the control signal.

5. The slew rate acceleration circuit of claim 4, wherein:
the at least one driving transistor comprises first and second driving transistors,
the at least one acceleration transistor comprises first and second acceleration transistors,
a source electrode of the first driving transistor and a drain electrode of the second acceleration transistor are connected to a first power supply voltage, and
a source electrode of the second driving transistor and a drain electrode of the first acceleration transistor are connected to a second power supply voltage.

6. The slew rate acceleration circuit of claim 5, wherein:
a source electrode of the first acceleration transistor and a gate electrode of the first driving transistor are connected in common to a first output terminal of the current mirror circuit, and
a source electrode of the second acceleration transistor and a gate electrode of the second driving transistor are connected in common to a second output terminal of the current mirror circuit.

7. The slew rate acceleration circuit of claim 5, wherein:
the first driving transistor and the first acceleration transistor are PMOS transistors, and
the second driving transistor and the second acceleration transistor are NMOS transistors.

8. A buffer circuit comprising:
an operational amplifier configured to amplify an input voltage and output an output voltage through an output node;
a current detection circuit configured to: detect a current flowing through a load stage of the operational amplifier;
a control circuit configured to:
compare a value of the detected current with an adjustable reference value; and
supply an adjusting driving voltage, to accelerate a slew rate of the operational amplifier, to an output stage comprising at least one driving transistor of the operational amplifier based on a control signal; and
a slew rate acceleration circuit comprising a first bias transistor and a second bias transistor, and configured to adjust the adjustable reference value according to a first bias voltage applied to a gate electrode of the first bias transistor and a second bias voltage applied to a gate electrode of the second bias transistor,
wherein each bias transistor is connected to the control circuit, and
wherein the control circuit comprises at least one acceleration transistor, and a source electrode of the at least one acceleration transistor is connected to a gate electrode of the at least one driving transistor.

9. The buffer circuit of claim 8, wherein the load stage comprises a current mirror circuit, and
wherein the control circuit is configured to supply the adjusting driving voltage to the gate electrode of the at least one driving transistor.

10. The buffer circuit of claim 9, wherein:
the current detection circuit comprises a current sensing transistor configured to perform a current mirror operation with respect to the current flowing through the load stage, and
a gate electrode of the current sensing transistor is connected to a gate electrode of a transistor constituting the current mirror circuit of the load stage.

11. The buffer circuit of claim 10, wherein:
the current mirror operation is configured to transmit the control signal to a gate electrode of the at least one acceleration transistor, and
the at least one acceleration transistor is configured to turn on/off based on the control signal.

12. The buffer circuit of claim 11, wherein:
the at least one driving transistor comprises first and second driving transistors,
the at least one acceleration transistor comprises first and second acceleration transistors,
a source electrode of the first driving transistor and a drain electrode of the second acceleration transistor are connected to a first power supply voltage, and
a source electrode of the second driving transistor and a drain electrode of the first acceleration transistor are connected to a second power supply voltage.

13. The buffer circuit of claim 12, wherein:
a source electrode of the first acceleration transistor and a gate electrode of the first driving transistor are connected in common to a first output terminal of the current mirror circuit, and
a source electrode of the second acceleration transistor and a gate electrode of the second driving transistor are connected in common to a second output terminal of the current mirror circuit.

14. The buffer circuit of claim 12, wherein the first driving transistor and the first acceleration transistor are PMOS transistors, and the second driving transistor and the second acceleration transistor are NMOS transistors.

* * * * *